(12) United States Patent
Takemoto et al.

(10) Patent No.: US 8,022,515 B2
(45) Date of Patent: Sep. 20, 2011

(54) SEMICONDUCTOR DEVICE

(75) Inventors: Yasuo Takemoto, Yokohama (JP);
Tetsuya Sato, Yokkaichi (JP);
Katsuyoshi Watanabe, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 497 days.

(21) Appl. No.: 12/106,511

(22) Filed: Apr. 21, 2008

(65) Prior Publication Data
US 2008/0277770 A1 Nov. 13, 2008

(30) Foreign Application Priority Data
Apr. 27, 2007 (JP) ................................. P2007-119798

(51) Int. Cl.
*H01L 23/495* (2006.01)
(52) U.S. Cl. ................. 257/676; 257/666; 257/E23.031
(58) Field of Classification Search .................. 257/666, 257/676, E23.031
See application file for complete search history.

(56) References Cited

U.S. PATENT DOCUMENTS

| | | | | |
|---|---|---|---|---|
| 4,891,687 A | * | 1/1990 | Mallik et al. .................. | 257/676 |
| 5,340,771 A | * | 8/1994 | Rostoker ......................... | 29/827 |
| 5,534,467 A | * | 7/1996 | Rostoker ......................... | 29/827 |
| 5,986,209 A | * | 11/1999 | Tandy ............................ | 174/530 |
| 6,034,423 A | * | 3/2000 | Mostafazadeh et al. ...... | 257/691 |
| 6,057,598 A | * | 5/2000 | Payne et al. .................... | 257/723 |
| 6,146,919 A | * | 11/2000 | Tandy ............................ | 438/106 |
| 6,215,176 B1 | * | 4/2001 | Huang ........................... | 257/666 |
| 6,256,200 B1 | * | 7/2001 | Lam et al. ...................... | 361/704 |
| 6,278,616 B1 | * | 8/2001 | Gelsomini et al. ............. | 361/803 |
| 6,388,313 B1 | * | 5/2002 | Lee et al. ....................... | 257/686 |
| 6,424,541 B1 | * | 7/2002 | Fazelpour ...................... | 361/760 |
| 6,555,917 B1 | * | 4/2003 | Heo ................................ | 257/777 |
| 6,737,750 B1 | * | 5/2004 | Hoffman et al. ............... | 257/777 |
| 6,841,858 B2 | * | 1/2005 | Shim et al. ..................... | 257/676 |
| 2001/0013643 A1 | * | 8/2001 | Nakanishi et al. ............. | 257/678 |
| 2002/0014689 A1 | * | 2/2002 | Lo et al. ......................... | 257/686 |
| 2002/0064905 A1 | * | 5/2002 | Park et al. ...................... | 438/109 |
| 2002/0096755 A1 | | 7/2002 | Fukui et al. | |
| 2002/0160552 A1 | * | 10/2002 | Minamio et al. .............. | 438/108 |
| 2003/0148597 A1 | * | 8/2003 | Tan et al. ....................... | 438/612 |
| 2003/0207516 A1 | * | 11/2003 | Tan et al. ....................... | 438/200 |
| 2007/0023875 A1 | | 2/2007 | Okane et al. | |
| 2007/0102801 A1 | | 5/2007 | Ishida et al. | |
| 2008/0138933 A1 | * | 6/2008 | Yoshida ......................... | 438/109 |

FOREIGN PATENT DOCUMENTS

| | | | |
|---|---|---|---|
| JP | 11068015 A | * | 3/1999 |
| JP | 2002-222913 | | 8/2002 |
| JP | 2007-35865 | | 2/2007 |
| JP | 2007-134486 | | 5/2007 |

* cited by examiner

*Primary Examiner* — Jarrett Stark
(74) *Attorney, Agent, or Firm* — Oblon, Spivak, McClelland, Maier & Neustadt, L.L.P.

(57) ABSTRACT

A semiconductor device includes a lead frame having an element support and a lead portion. The lead frame has an area from the element support to inner leads of the lead portion, which is formed flat. First and second semiconductor elements are stacked in order on a lower surface of the lead frame. Electrode pads of the first semiconductor element are connected to the inner leads via first metal wires. Ends of the first metal wires, which are connected to the first semiconductor element, are embedded in the second adhesive layer of the second semiconductor element.

20 Claims, 11 Drawing Sheets

FIG. 15

SEMICONDUCTOR DEVICE

CROSS-REFERENCE TO RELATED APPLICATIONS

This application is based upon and claims the benefit of priority from the prior Japanese Patent Application No. 2007-119798, filed on Apr. 27, 2007; the entire contents of which are incorporated herein by reference.

BACKGROUND OF THE INVENTION

1. Field of the Invention

The present invention relates to a semiconductor device having a plural semiconductor elements.

2. Description of the Related Art

Semiconductor devices, in which plural semiconductor elements are stacked and sealed in a single package, have been used in purpose of downsizing and high-density packaging of semiconductor devices. In view of reducing cost of the semiconductor devices (semiconductor packages), inexpensive lead frames are used as circuit substrates to mount semiconductor elements. In such semiconductor device (TSOP, etc.) using the lead frame, the semiconductor elements are sequentially mounted on an element support of the lead frame. Electrode pads of the semiconductor elements are electrically connected to leads of the lead frame via metal wires (bonding wires).

When the semiconductor elements are mounted on one surface of the lead frame, the lead frame, which is depressed to form its element support lower than the leads, is employed in order to increase the number of mountable semiconductor elements. Such a depression process causes an increased lead frame manufacturing cost, and further, an increased semiconductor device manufacturing cost. Since the depressed lead frame has an inclined portion, the size of mountable semiconductor elements is limited.

It has been considered to stack plural semiconductor elements on both surfaces of a lead frame (JP-A 2007-035865 (KOKAI)). In this case, a resin molding is performed in a state that the semiconductor elements are mounted on the both surfaces of the lead frame so that the filling performance of the sealing resin is reduced because of its pad arrangement on the semiconductor element and lead frame shape due to the pat arrangement. In view of this point, it is preferable that semiconductor elements are stacked and mounted only one surface of the lead frame. However, according to the conventional semiconductor device having a single-side stacked structure, there have been problems such as an increased manufacturing cost due to the depression process, and element size limitations.

In semiconductor devices (BGA, etc.) in which semiconductor elements are mounted on a wiring board, plural semiconductor elements are stacked to be mounted. When a wire bonding is executed in a stacked semiconductor elements, the semiconductor elements are preferably stacked in a stepped manner to expose electrode pads of the respective elements. In this case, the area of the wiring board occupied by the semiconductor elements increases as the number of the semiconductor elements increases. Thus, the size of the semiconductor elements mountable to the wiring board is needed to be limited.

BRIEF SUMMARY OF THE INVENTION

A semiconductor device according to an aspect of the present invention includes: a lead frame including an element support and a lead portion having inner leads and outer leads, the lead frame having an area from the element support to the inner leads formed flat; a first semiconductor element having a first electrode forming surface on which first electrode pads are formed, the first semiconductor element being adhered to a lower surface of the lead frame via a first adhesive layer with the first electrode forming surface facing downward; a second semiconductor element having a second electrode forming surface on which second electrode pads are formed, the second semiconductor element being adhered to the first electrode forming surface of the first semiconductor element via a second adhesive layer with the second electrode forming surface facing downward; first metal wires electrically connecting the inner leads and the first electrode pads; second metal wires electrically connecting the inner leads and the second electrode pads; and a resin sealer sealing the first and second semiconductor elements together with the first and second metal wires, wherein ends of the first metal wires, which are connected to the first semiconductor element, are embedded in the second adhesive layer.

A semiconductor device according to another aspect of the present invention includes: a lead frame including an element support and a lead portion having inner leads and outer leads, the lead frame having an area from the element support to the inner leads formed flat; an element group including a plurality of semiconductor elements having electrode forming surfaces on which electrode pads are formed, the semiconductor elements being sequentially stacked at a lower surface of the lead frame via adhesive layers to have their electrode forming surfaces facing downward; metal wires electrically connecting the inner leads and the electrode pads of the semiconductor elements; and a resin sealer sealing the element group together with the metal wires, wherein ends of the metal wires, which are connected to the semiconductor element located at an upper side in the element group, is embedded in the adhesive layer of the semiconductor element located at an lower side in the element group.

A semiconductor device according to another aspect of the present invention includes: a circuit substrate including an element mounting portion and connecting portions; a first element group having a plurality of semiconductor elements having electrode pads arranged along outer edges thereof, the semiconductor elements being stacked in a stepped manner on the element mounting portion of the circuit substrate to expose the electrode pads; a second element group having a plurality of semiconductor elements having electrode pads arranged along outer edges thereof, the semiconductor elements being stacked in a stepped manner on the first element group via a spacer layer to expose the electrode pads; first metal wires electrically connecting the connecting portions of the circuit substrate and the electrode pads of the semiconductor elements in the first element group; second metal wires electrically connecting the connecting portions of the circuit substrate and the electrode pads of the semiconductor elements in the second element group; and a resin sealer sealing the first and second element groups together with the first and second metal wires.

DETAILED DESCRIPTION OF THE INVENTION

Embodiments for realizing the present invention will be described.

Figure 1:
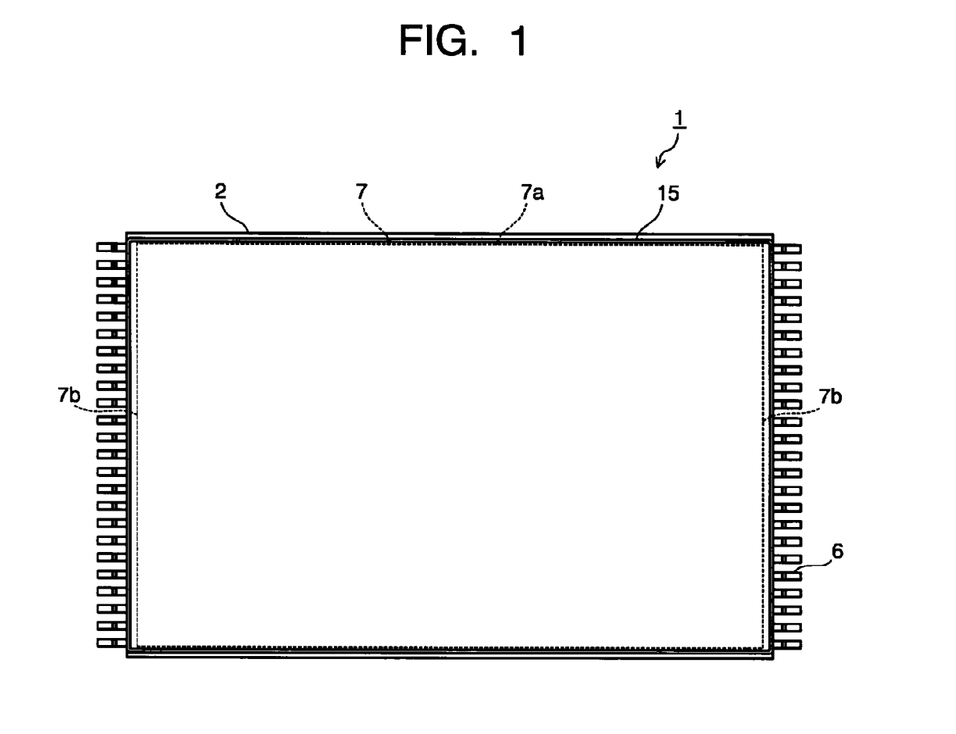
FIG. 1 is a plan view showing a semiconductor device according to a first embodiment.
Figure 2:
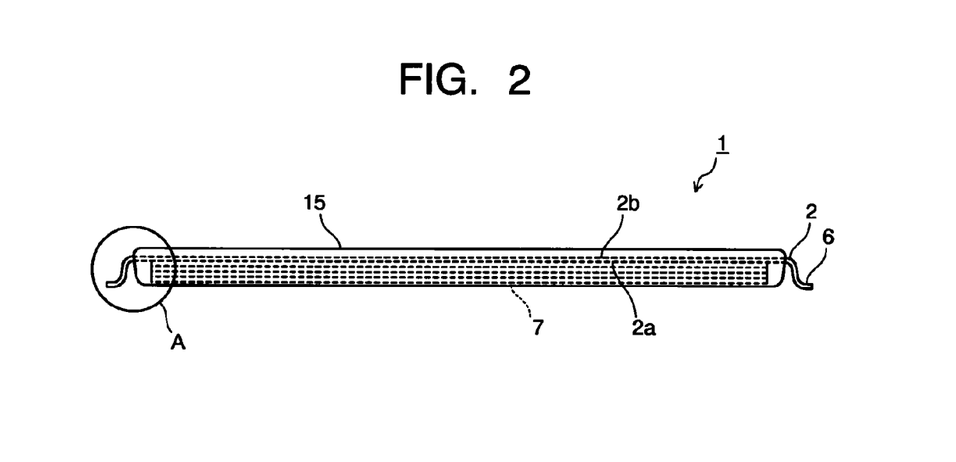
FIG. 2 is a front view showing the semiconductor device of FIG. 1.
Figure 3:
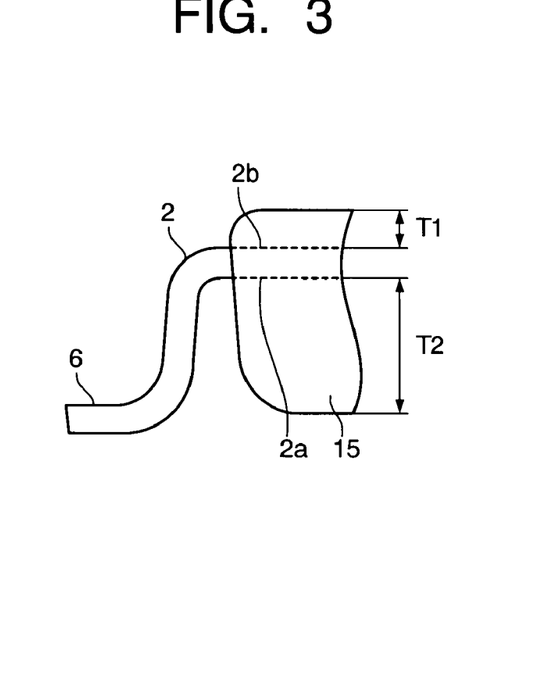
FIG. 3 is an enlarged view showing the portion A of FIG. 2.
Figure 4:
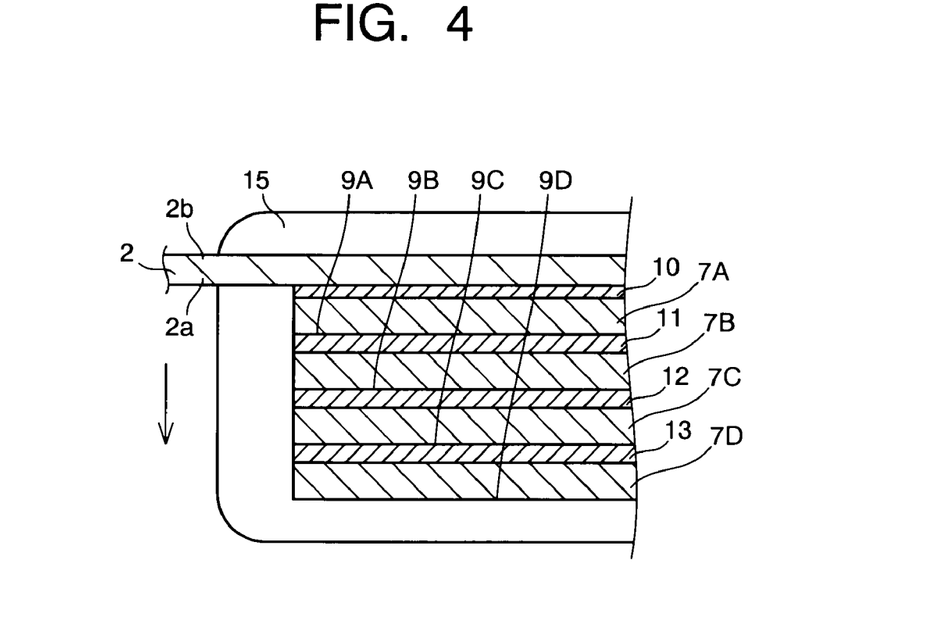
FIG. 4 is a sectional view showing the portion A of FIG. 3.
Figure 5:
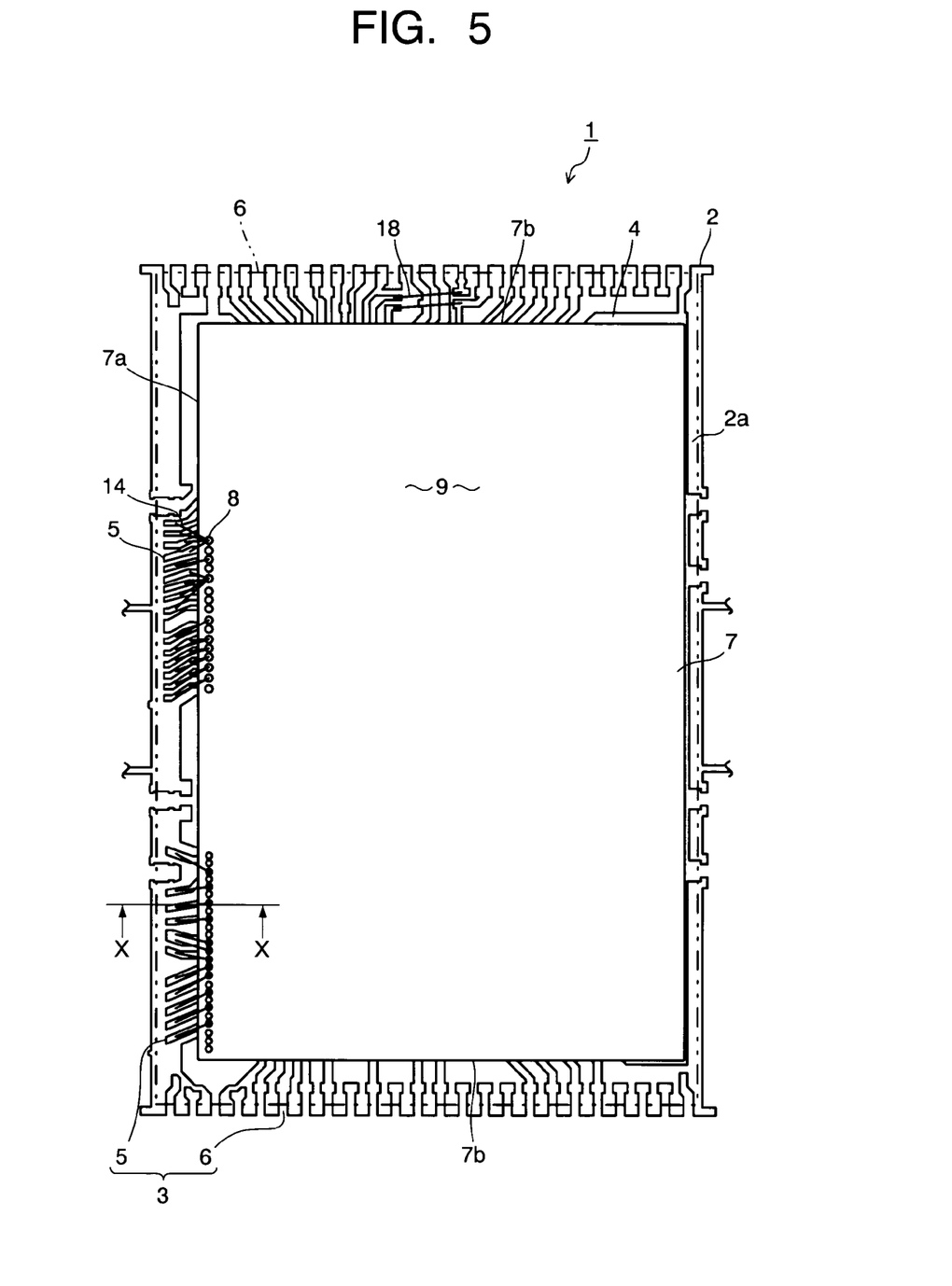
FIG. 5 is a plan view showing the semiconductor device in which semiconductor elements are mounted on a lead frame according to the first embodiment.
Figure 6:
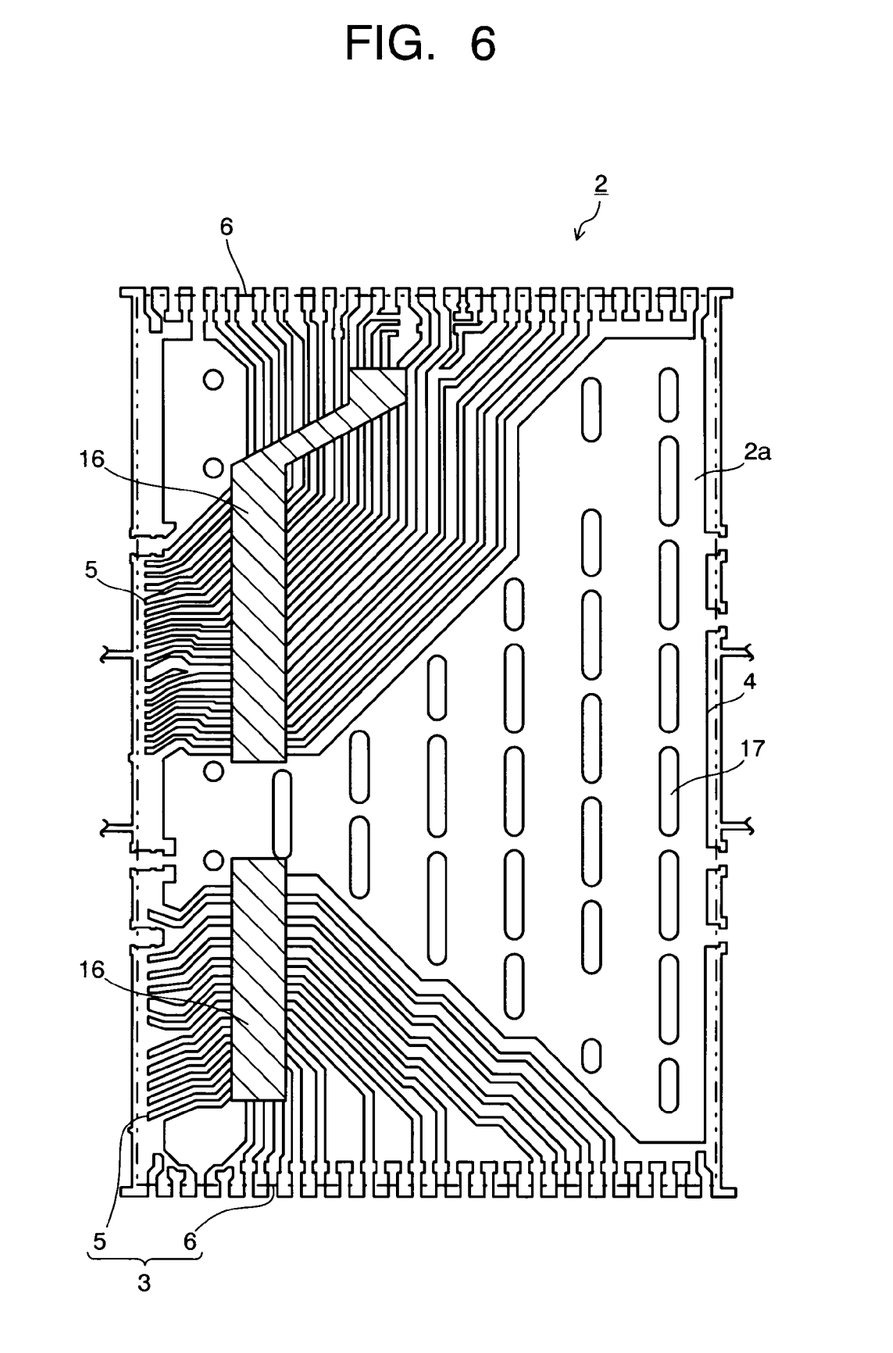
FIG. 6 is a plan view showing a configuration of the lead frame of the semiconductor device according to the first embodiment.
Figure 7:
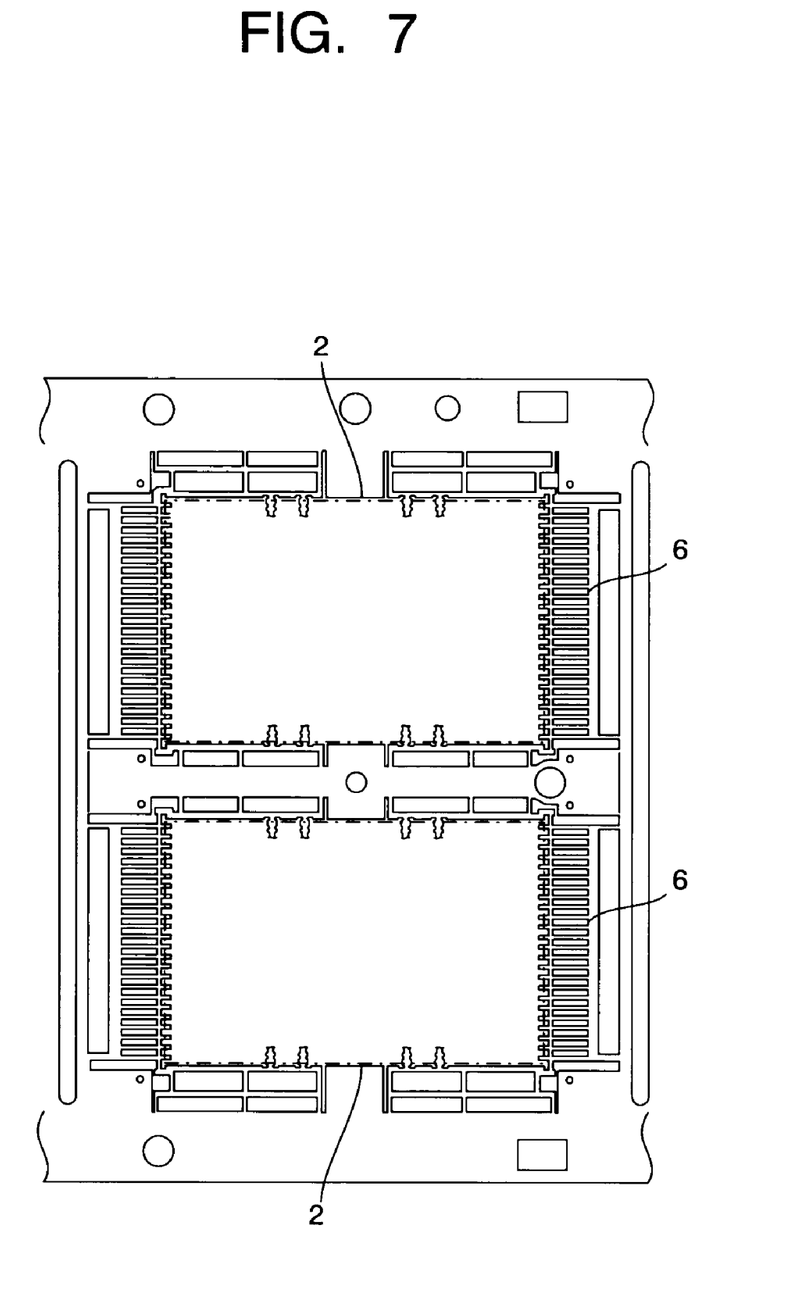
FIG. 7 is a plan view showing an entire configuration of the lead frame of the semiconductor device according to the first embodiment.
Figure 8:
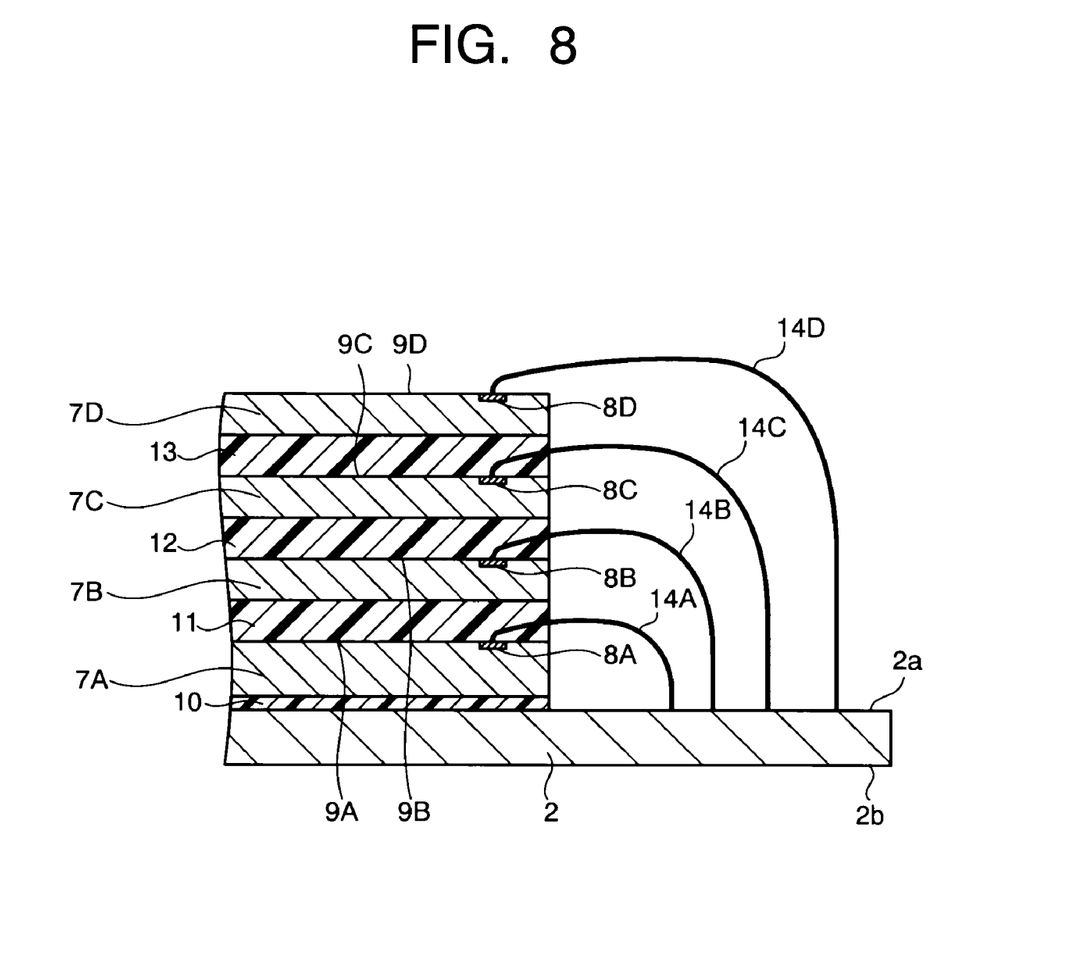
FIG. 8 is a sectional view along the line X-X in FIG. 5.

A semiconductor device (semiconductor package) according to a first embodiment of the present invention will be described with reference to FIGS. 1 to 8. FIGS. 1 and 2 show an appearance of the semiconductor device according to the first embodiment. FIGS. 3 and 4 show enlarged views of the portion A in FIG. 2. FIG. 5 shows a semiconductor element mounted on a lead frame. FIGS. 6 and 7 show configurations of the lead frame. FIG. 8 shows a connecting state of metal wires (bonding wires) to the stacked semiconductor element.

A semiconductor device 1 shown in the figures includes a lead frame 2 as an element mounting circuit substrate. As shown in FIG. 6, the lead frame 2 has a lead portion 3 and an element support 4. The lead portion 3 has inner leads 5 serving as a connector connecting with semiconductor elements, which are mounted on the lead frame 2, and outer leads 6 serving as an external device connector. The lead portion 3 is composed of plural leads. The outer leads 6 protrude outwardly as shown in FIG. 7 although a part of the outer leads 6 is not shown in FIGS. 5 and 6.

The lead frame 2 has a first surface 2a as its lower surface and a second surface 2b as its upper surface. As shown in FIGS. 2, 3 and 4, semiconductor elements 7 are mounted on the lower surface (first surface) 2a of the lead frame 2. FIGS. 5 to 7 show the lower surface 2a of the lead frame 2. FIG. 8 shows the semiconductor device 1 in a reversed state, in which the lower surface 2a of the lead frame 2 is turned to face upward. Regarding the lower surface and upper surface of the lead frame 2, when the outer leads 6 are connected to a mounting board, the surface which faces a front surface of the mounting board is defined as the lower surface 2a and the surface opposite to the surface facing to the mounting board is defined as the upper surface 2b.

On the lower surface 2a of the lead frame 2, a first semiconductor element 7A, a second semiconductor element 7B, a third semiconductor element 7C and a fourth semiconductor element 7D are stacked and mounted in order. The first to fourth semiconductor elements 7A to 7D constitute an element group. As illustrative examples of the first to fourth semiconductor elements 7A to 7D, there are semiconductor memory elements such as an NAND type flash memory. The number of mounted semiconductor elements 7 is preferably more than one (at least two) and should not be limited to four. The number of the semiconductor elements 7 accommodated in the semiconductor device 1 can be two, three, five or more.

The first semiconductor element 7A has an electrode forming surface 9A on which first electrode pads 8A are formed. As shown in FIG. 4, the first semiconductor element 7A is adhered to the lower surface 2a of the lead frame 2 via a first adhesive layer 10, in a manner that the electrode forming surface 9A faces downward (that is, the direction which the lower surface 2a of the lead frame 2 faces, and the direction indicated by the arrow in FIG. 4). As described below, the inner leads 5 are wired from the outer leads 6 arranged in short edges (short sides) 7b, 7b of the semiconductor element 7 toward the pad arrangement side (long edge (long side) 7a) of the semiconductor element 7. Thus, the first semiconductor element 7A is adhered not only to the element support 4 but also to a part of the inner leads 5 via the first adhesive layer 10.

The first adhesive layer 10 is made of a typical die-bonding material, that is, an insulating adhesive material including, as a major component, such as silicone resin, polyimide resin, epoxy resin or acrylic resin. Preferably, the first adhesive layer 10 has a thickness of 10 to 30 μm. When the thickness of the first adhesive layer 10 is less than 10 μm, it can be considered that the insulating performance between the lead frame 2 and the first semiconductor element 7A cannot sufficiently be maintained. When the thickness of the first adhesive layer 10 is more than 30 μm, the thickness of the stacked semiconductor elements 7 is increased.

Similarly, the second to fourth semiconductor elements 7B to 7D have electrode forming surfaces 9B, 9C, 9D on which second to fourth electrode pads 8B, 8C, 8D are formed. The second semiconductor element 7B is adhered to the electrode forming surface 9A of the first semiconductor element 7A via a second adhesive layer 11 in a manner that the electrode forming surface 9B faces downward. The third semiconductor elements 7C is adhered to the electrode forming surface 9B of the second semiconductor element 7B and the fourth semiconductor element 7D is adhered to the electrode forming surface 9C of the third semiconductor element 7C respectively via third and fourth adhesive layers 12, 13 in a manner that the electrode forming surfaces 9C, 9D face downward.

The first to fourth semiconductor elements 7A to 7D are formed in a same rectangular shape and stacked so that those long edges (long sides) 7a and short edges (short sides) 7b are aligned in the same direction. In other words, the first to fourth semiconductor elements 7A to 7D are stacked to have their own edges being aligned and the area of the lead frame 2 occupied by the semiconductor elements 7A, 7B, 7C, 7D (stacked elements occupied area) becomes minimum (which is equivalent to the area of a single semiconductor element 7). When a large semiconductor element 7 is contained, it suppresses an increase in a package size.

The electrode pads 8A to 8D of the first to fourth semiconductor elements 7A to 7D are electrically connected the inner leads 5 via the first to fourth metal wires 14A to 14D, respectively. The metal wires 14 are made of typical thin metallic wires such as Au wires and Cu wires. The metal wires 14 are preferably wire bonded by a reverse bonding capable of reducing the height of the loops. In other words, a metal bump is previously formed on the electrode pad 8. Ends of the metal wires 14 are ball connected to the inner leads 5 and the other ends are connected to the metal bumps formed on the electrode pad 8.

The first to fourth semiconductor elements 7A to 7D are stacked so that those edges are aligned. It is thus considered that the first to third metal wires 14A to 14C connected to the first to third semiconductor elements 7A to 7C are interfered with the semiconductor elements 7, which are disposed thereunder (upper side, in FIG. 8), and this can cause problems such as a short circuit. The end of the first metal wire 14A (element side end), which is connected to the first electrode pad 8A, is embedded in the second adhesive layer 11. Similarly, the element side ends of the second and third metal wires 14B, 14C are embedded in the third and fourth adhesive layers 12, 13, which are disposed thereunder.

In a manufacturing process of the semiconductor device 1, as shown in FIG. 8, the first to fourth semiconductor elements 7A to 7D are stacked on the first surface 2a of the lead frame in order. The element side end of the first metal wire 14A is embedded in the second adhesive layer 11 disposed there above. The element side ends of the second and third metal wires 14B, 14C are embedded similarly. The first to fourth semiconductor elements 7A to 7D are firstly stacked and then inversed when the semiconductor device 1 is used. The element side ends of the first to third metal wires 14A to 14C are embedded in the second to fourth adhesive layers 11 to 13, which are disposed under the wires 14A to 14C later.

Except for the lowest fourth semiconductor element 7D, the ends of the metal wires 14A, 14B, 14C, which is connected to the semiconductor elements 7A, 7B, 7C located at the upper side in the element group, are embedded in the adhesive layers 11, 12, 13 of the semiconductor elements 7B, 7C, 7D located at the lower side in the element group. With this structure, a contact between the first metal wires 14A and the second semiconductor element 7B, a contact between the second metal wires 14B and the third semiconductor element 7C, and a contact between the third metal wires 14C and the fourth semiconductor element 7D can be prevented. The metal wires 14 are apart from the semiconductor elements 7 corresponding to the thickness of the adhesive layers 11, 12, 13. Thus, the second to fourth adhesive layers 11, 12, 13 serve as spacer layers.

The second to fourth adhesive layers 11 to 13 serving as spacer layers are made of insulating resin capable of being softened to introduce the metal wires 14 therein in response to the temperature for adhering the semiconductor elements 7, in addition to realizing an adhesive function. Such insulating resin can be, for example, a thermoplastic resin such as an acrylic resin or a thermosetting resin such as an epoxy resin. Preferably, the adhesive layers 11, 12, 13 have a thickness in a range of 30 to 100 μm and, more preferably, in a range of 50 to 85 μm. When the adhesive layers 11, 12, 13 have a thickness less than 30 μm, it is considered that the contact between the metal wires 14 and the semiconductor elements 7 cannot be prevented. When the adhesive layers 11, 12, 13 have a thickness more than 100 μm, the stacked semiconductor elements 7 becomes too thick.

It is noted that the thickness of the semiconductor elements 7A to 7D are not always limited. The thickness of the first semiconductor element 7A, which is a lowest side during the wire bonding, is preferably thicker than the thickness of the other semiconductor elements 7B, 7C, 7D. More concretely, the first semiconductor element 7A and the first adhesive layer 10 have preferably a total thickness of 100 μm or more. When the thickness of the first semiconductor element 7A is too thick, the thickness of the stacked elements becomes thick. The thickness of the first semiconductor element 7A and the first adhesive layer 10 is preferably 150 μm or less in total.

When the total thickness of the first semiconductor element 7A and first adhesive layer 10 is under 100 μm, the first semiconductor element can be damaged during the wire bonding. The first semiconductor element 7A preferably has a thickness in a range of 80 to 100 μm. Since the bonding damage is absorbed by the adhesive layers 11, 12, 13 thereunder during the wire bonding, the other semiconductor elements 7B, 7C, 7D are not likely to receive damages even when the elements 7B, 7C, 7D are made thinner. It is thus preferable to provide thin semiconductor elements 7B, 7C, 7D in order to suppress an increased thickness of the stacked element.

Preferably, the second to fourth semiconductor elements 7B to 7D have a thickness under 80 μm, more preferably, 70 μm or less, to control an increase in the stacked thickness. The lower limit value of the thickness of the second to fourth semiconductor elements 7B to 7D is not limited but, preferably, the second to fourth semiconductor elements 7B to 7D are made thinner in a manufacturable range in a typical semiconductor element manufacturing process (for example, 20 μm or more). Practically, it is preferable to provide the second to fourth semiconductor elements 7B to 7D to have a thickness of 50 μm or more. As selecting any degree of thickness, it is preferable to provide the first semiconductor element 7A thicker than the other semiconductor elements 7B, 7C, 7D.

The first to fourth semiconductor elements 7A to 7D stacked and mounted on the lower surface 2a of the lead frame 2 are sealed, by the resin sealer 15, together with the inner lead and first to fourth metal wires 14A to 14D. The resin sealer 15 is made of a typical thermosetting resin such as an epoxy resin. These components constitute the semiconductor device 1 having a single-side stacked structure. The semiconductor device 1 of the first embodiment is suitable for a semiconductor memory device, in which semiconductor memory elements are stacked to attain a high capacity.

As described above, the first to fourth semiconductor elements 7A to 7D are stacked and mounted on one surface (lower surface 2a) of the lead frame 2. Accordingly, in order to provide the thickness of the stacked semiconductor elements 7 within a thickness of the semiconductor device 1, the portion from the element support 4 to the inner lead 5 on the lead frame 2 are made flat, and the flat portion of the element support 4 and inner lead 5 is disposed in an upper side of the resin sealer 15. In other words, a projecting portion (rim portion of the lead) of the lead frame 2, which is projected from the resin sealer 15, are placed upward compared to a typical structure in order to maintain a space under the lead frame 2.

More concretely, as shown in FIG. 3, the thickness (upper resin thickness) T1 from the upper surface 2b of the lead frame 2 to the upper portion of the resin sealer 15 is made thin, and the thickness (lower resin thickness) T2 from the lower surface 2a of the lead frame 2 to the lower portion of the resin sealer 15 is made thick. With such a structure, the semiconductor elements 7 can be stacked on only one surface (lower surface 2a) of the lead frame 2 without performing a depressing process to the lead frame 2.

For example, when the lead frame 2 has a thickness of 125 μm, the first semiconductor element 7A and first adhesive layer 10 has a total thickness of 110 μm (element thickness of 85 μm+adhesive layer thickness of 25 μm), each of the second to fourth semiconductor elements 7B to 7D has a thickness of 70 μm, each of the second to fourth adhesive layers 11 to 13 has a thickness of 60 μm and the resin sealer 15 has a thickness of 1000 µm (1 mm), the resin sealer 15 is made to have the upper resin thickness T1 of 185 µm and the lower resin thickness T2 of 690 µm.

With such a structure, the stacked semiconductor elements 7 (stacked thickness is 400 µm) can be mounted on only one surface (lower surface 2a) of the lead frame 2 which is not depressed. Further, since the projecting portion (rim portion of the leads) of the lead frame 2, which extend from the resin sealer 15, is placed upward, the height of the outer leads 6 becomes larger. Accordingly, the springback effect of the outer leads 6 when the semiconductor device 1 is mounted on the mounting board and the like is improved, and the mounting reliability of the semiconductor device 1, particularly, the reliability (operation life) related to temperature cycles can be improved.

Further, since the a portion of the lead frame 2 (the element support 4 and inner leads 5), which faces to the semiconductor elements 7, is made flat, this enlarges a size of the semiconductor elements 7 mountable to the lead frame 2, compared to the case that the lead frame 2 is depressed, if the size of the resin sealer 15 is the same. The element size mountable to the lead frame 2 can also be enlarged by laying the plural semiconductor elements 7 to have their respective edges aligned. With this structure, semiconductor elements 7 having larger element size can be mounted.

A pad arrangement configuration of the semiconductor element 7 and a concrete shape of the lead frame 2 will be described. The first to fourth electrode pads 8A to 8D are arranged along outer shape sides, concretely long edges 7a, of the first to fourth semiconductor elements 7A to 7D. The first to fourth semiconductor elements 7A to 7D have a pad structure arranged along a single long edge (single long edge-pad structure), as shown in FIG. 5. The outer leads 6 are respectively disposed to project from both short edges 7b, 7b of the semiconductor elements 7. The outer leads 6 are projected from short edges of the semiconductor device 1.

Accordingly, it is required to dispose the outer leads 6 at both short edge sides of the lead frame 2. Further, it is required to dispose bonding portions of the inner leads 5 at the long edge side of the lead frame 2. The inner leads 5 are wired from the outer leads 6 toward a connecting position (position corresponding to one long edge 7a of the semiconductor element 7) connected to the semiconductor elements 7. More concretely, the inner leads 5 are wired from positions corresponding to the short edges 7b, 7b where the inner leads 5 are connected to the outer leads 6 toward the long edge 7a, as turning 90 degrees with two 45 degree inflections, for example. Using such lead frame 2 allows it to contain the semiconductor elements 7 having a single long edge-pad structure in the semiconductor device 1 having the outer leads 6 protruding from its short edges.

In the semiconductor elements 7 having a single long edge-pad structure, the element sizes are not limited and the number of connecting electrode can be increased, compared to semiconductor elements having a pad structure arranged along both short edges (both short edges-pad structure) or a pad structure arranged along a single short edge (single short edge-pad structure). In the both short edges-pad structure, the lead frame 2 can be made in a simplified shape, however, the element size in long side should be limited. In the single short edge-pad structure, the number of the connecting electrode should be limited, compared to the single long edge-pad structure. As described above, when the lead frame 2, in which the inner leads 5 are wired and the semiconductor elements 7 having the single long edge-pad structure are combined, semiconductor elements 7 which are large and includes more electrodes can be mounted on the lead frame 2.

The connecting portion connecting with the semiconductor elements 7 can be movable because the inner leads 5 are wired from the short edges 7b, 7b to the long edge 7a. The portion around the connecting portion of the inner leads 5 (a part of the inner leads 5) connected with the semiconductor elements 7 is fixed using an insulating tape 16. With this structure, the bonding ability to the inner lead 5 and the handling ability of the lead frame 2 are improved. Further, the element support 4, which is connected to the two opposite edges (here, the opposite long edges) of the lead frame 2, are disposed in a space defined by the inflections of the inner leads 5 at two points. With this structure, the supporting ability of the lead frame 2 for supporting the semiconductor elements 7 is improved. Since the element support 4 has a through hole 17, its wettability of to the adhesive layer 10 is improved.

The inner leads 5 are wired from the short edges 7b, 7b to the long edge 7a, and so the inner leads 5 faces to the semiconductor elements 7 mounted on the lead frame 2. When semiconductor elements are mounted both faces of the lead frame 2 having such a configuration, the spaces of the lead frame 2 between the semiconductor elements cannot sufficiently be filled with a sealing resin. On the other hand, in this example, the semiconductor elements 7 are mounted on only one side of the lead frame 2, spaces of the lead frame 2 can sufficiently be filled with sealing resin. Thus, the semiconductor device 1 with a high sealing reliability can be obtained.

Here, a metal wire 18 shown in FIG. 5 is a branch wire, which is used when the number of the outer leads 6 is greater than the number of the inner leads 5. For example, when the number of the electrodes (chip enable, etc.) of the semiconductor elements 7 are two but four electrodes are required in the semiconductor device 1, there is no problem if the inner leads 5 can be branched (wire bonded and wired to plural points). When such branching is not available, an inner leads 5 for wiring back is provided to connect the increased outer leads 6 to the metal wire 18. When such a configuration is applied, the present invention can be applicable to various electrode arrangement structures.

Figure 9:
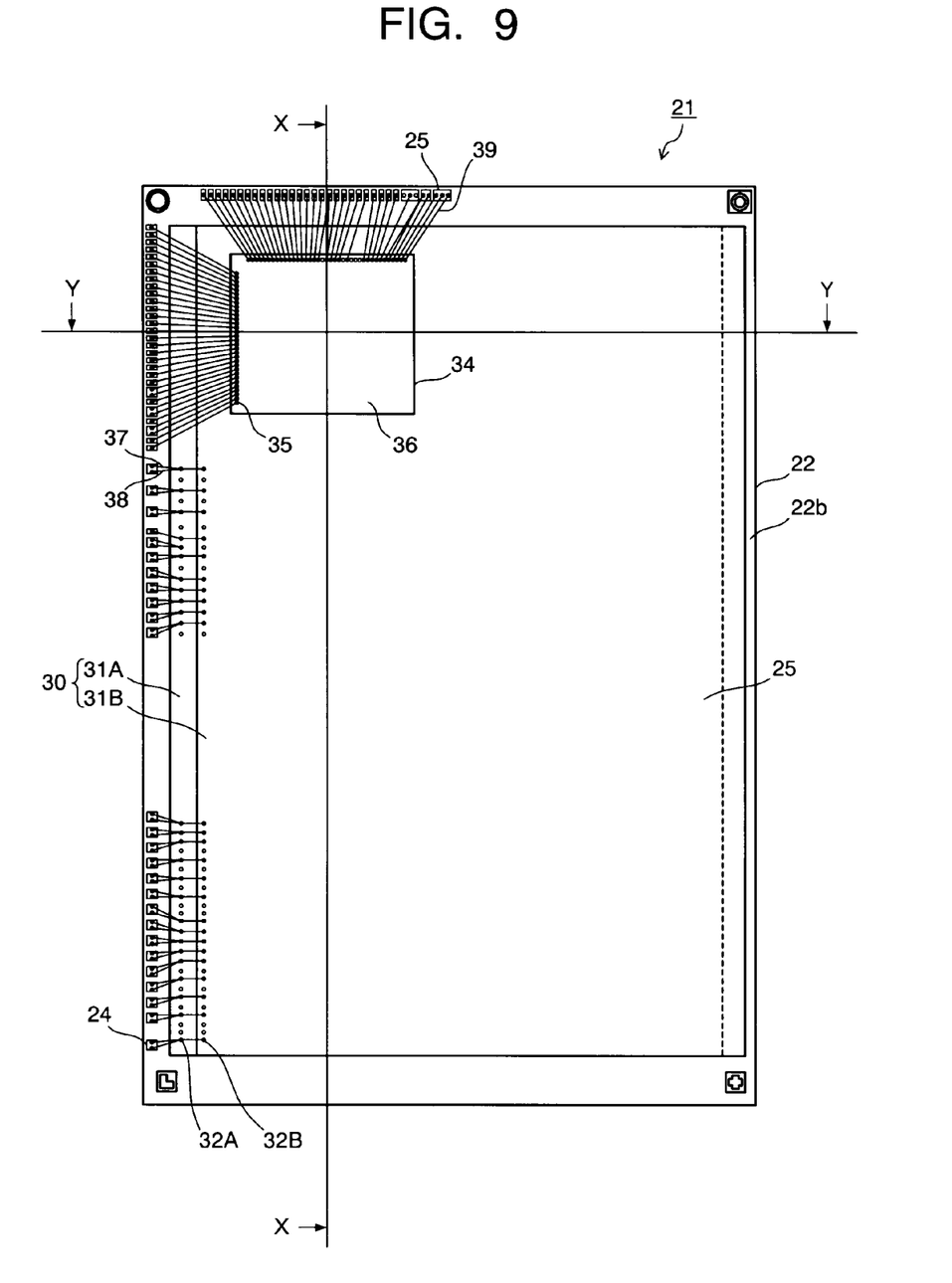
FIG. 9 is a plan view showing a semiconductor device according to a second embodiment.
Figure 10:
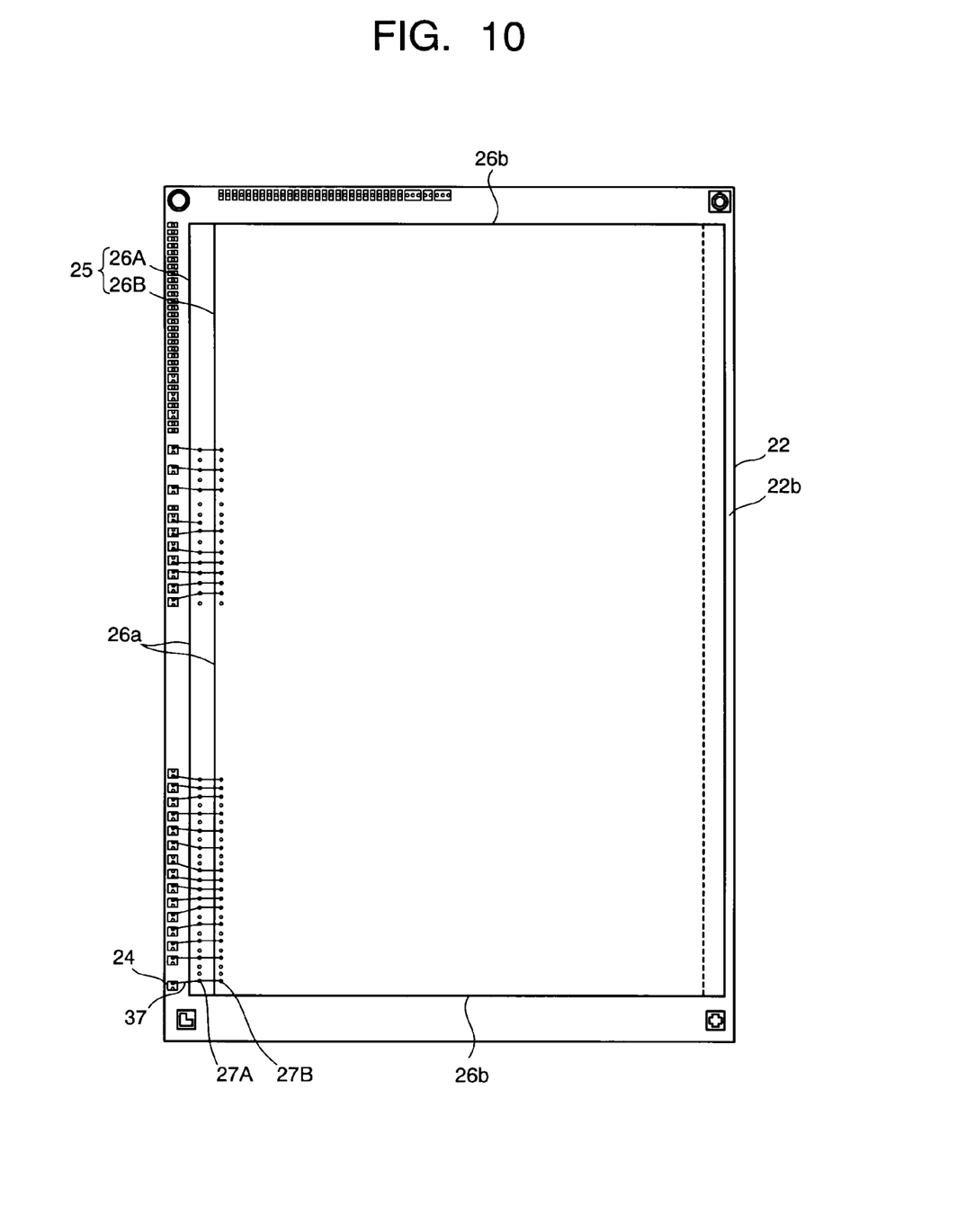
FIG. 10 is a plan view showing the semiconductor device in which a wire bonding is performed on a first element group according to the second embodiment.
Figure 11:
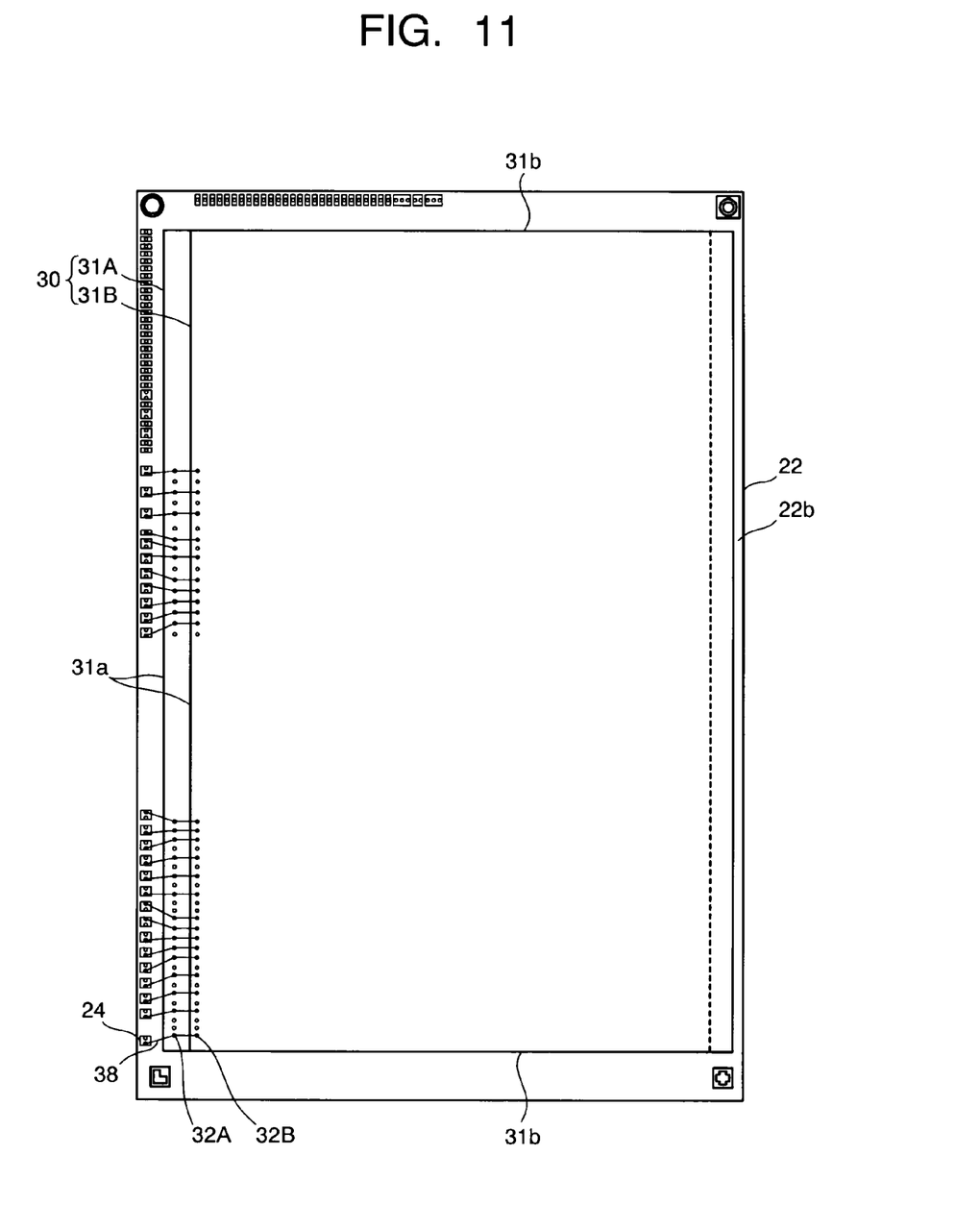
FIG. 11 is a plan view showing the semiconductor device in which a wire bonding is performed on a second element group according to the second embodiment.
Figure 12:
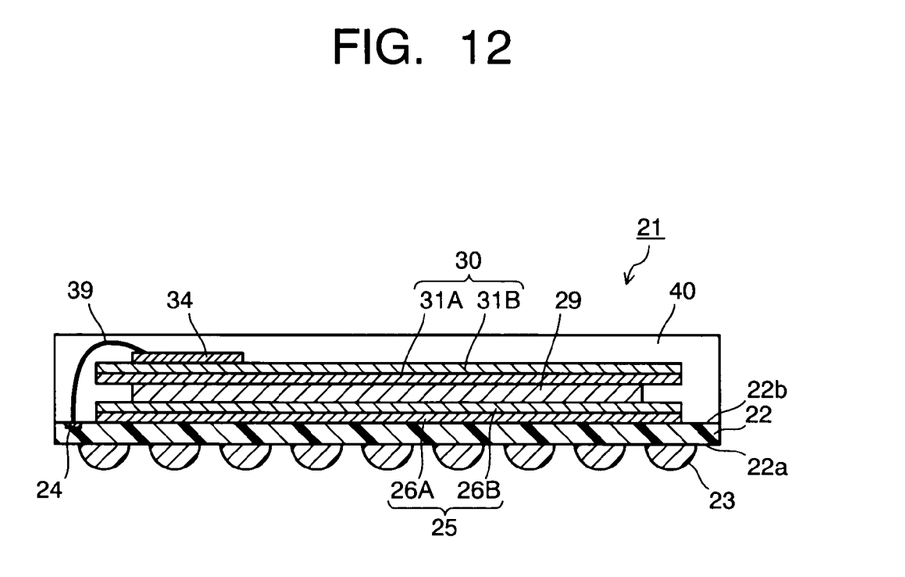
FIG. 12 is a sectional view along the line X-X in FIG. 9.
Figure 13:
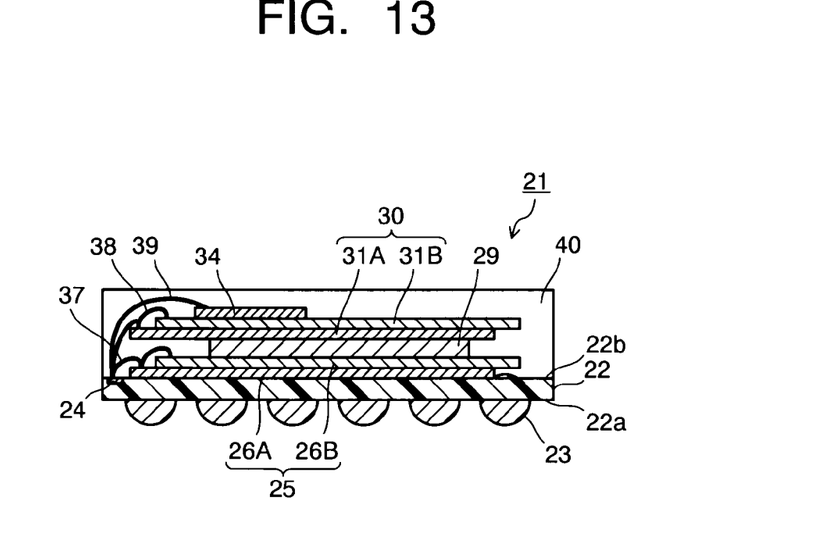
FIG. 13 is a sectional view along the line Y-Y in FIG. 9.
Figure 14:
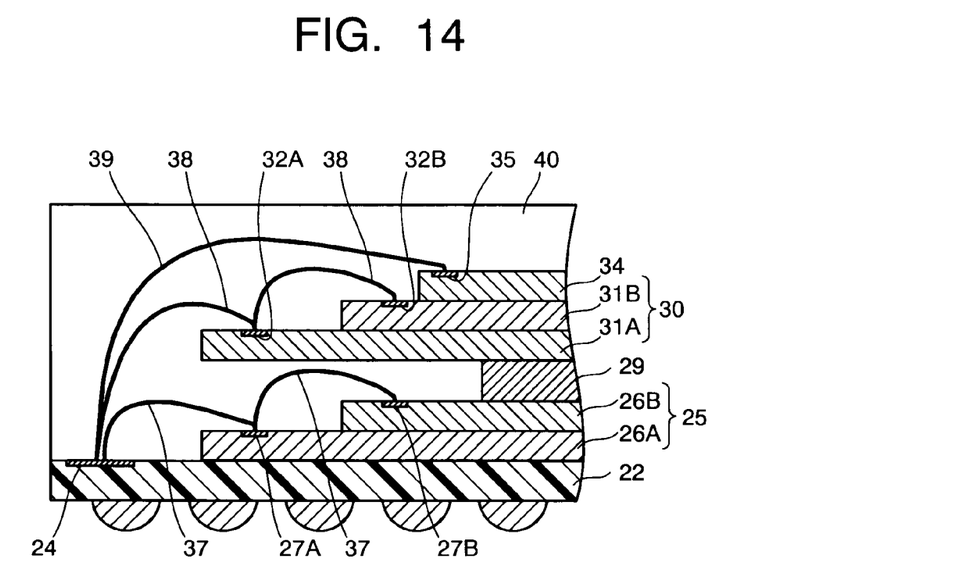
FIG. 14 is a sectional view showing a stacked structure of the semiconductor elements and a wire bonding condition in the semiconductor device according to the second embodiment.
Figure 15:
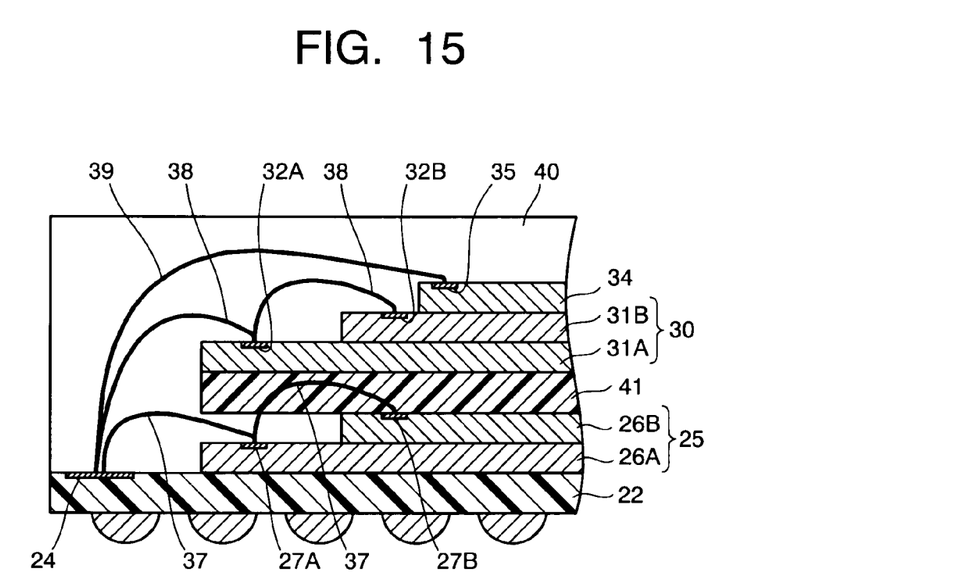
FIG. 15 is a sectional view showing a modification of the stacked structure of the semiconductor elements in FIG. 14.

A semiconductor device (semiconductor package) according to a second embodiment will be described with reference to FIGS. 9 to 15. FIG. 9 shows a plan view of the semiconductor device according to the second embodiment. FIG. 10 shows a wire bonding configuration of a first element group. FIG. 11 shows a wire bonding configuration of a second element group. FIGS. 12 and 13 show a cross-sectional view of the semiconductor device. FIG. 14 shows a concrete wire bonding condition of semiconductor elements and FIG. 15 shows a modification of the condition. A sealer is not shown in FIG. 9.

The semiconductor device 21 shown in these figures includes a wiring board 22 as a circuit substrate for mounting elements. The circuit substrate is capable of mounting semiconductor elements thereon and has a circuit component. The circuit substrate can be provided as a lead frame similarly to the first embodiment, as a substitute for the wiring board 22. The wiring board 22 includes a wiring network inside or on a surface of an insulating resin substrate, for example. More concretely, the wiring board 22 can be a printed wiring board, in which a glass-epoxy resin, BT resin (Bsmaleimide-Triazine resin) and the like are used.

On a first surface 22a, which is a lower surface of the wiring board 22, solder bumps, etc. are provided as external connection terminals 23. Since the semiconductor device 21 applied to a BGA package is shown here, solder bumps are provided, as external connection terminal 23, on the lower surface of the wiring board 22. The semiconductor device 21 is applicable to an LGA package, and, in such a case, metal lands are applied as the external connection terminal 23. On a second surface 22b, which is an upper surface of the wiring board 22, an element mounting portion and connection pads 24 are provided. The connection pads 24 are electrically connected to the external connection terminal 23 via the wiring network of the wiring board 22. The connection pads 24 serve as a connecting portion during a wire bonding.

The first and second semiconductor elements 26A, 26B, which constitute the first element group 25, are mounted in order on the element mounting portion of the wiring board 22. The first semiconductor element 26A is adhered to the element mounting portion via an adhesive layer, which is not shown. The second semiconductor element 26B is adhered to the first semiconductor element 26A via an adhesive layer, which is not shown. The semiconductor elements 26A, 26B are formed in the same rectangular shape. The first and second semiconductor elements 26A, 26B respectively include electrode forming surfaces in which electrode pads 27A, 27B are formed and disposed to have the electrode forming surface facing upward.

The third and fourth semiconductor elements 31A, 31B, which constitute the second element group 30, are stacked in order on the first element group 25 via the spacer layer 29. The spacer layer 29 is adhered on the second semiconductor element 26B via, for example, an adhesive layer, which is not shown. The third semiconductor element 31A is adhered on the spacer layer 29 via an adhesive layer, which is not shown. The fourth semiconductor element 31B is adhered on the third semiconductor element 31A via an adhesive layer, which is not shown. When an insulating resin layer, which has adhesiveness, is employed as the spacer layer 29, the adhesive layer adhering the third semiconductor element 31A are omitted.

The third and fourth semiconductor elements 31A, 31B are formed in the same rectangular shape. The third and fourth semiconductor elements 31A, 31B respectively have electrode forming surfaces, in which electrode pads 32A, 32B are formed, and their elements 31A, 31B are disposed to have the electrode forming surfaces facing upwardly. A fifth semiconductor element 34 is stacked on the fourth semiconductor element 31B. The fifth semiconductor element 34 is adhered on the fourth semiconductor element 31B via an adhesive layer, which is not shown. The fifth semiconductor element 34 is formed in a smaller shape compared to other semiconductor elements. The fifth semiconductor element 34 can be made to constitute a part of the second element group 30.

As an illustrative example of the first to fourth semiconductor elements 26A, 26B, 31A, 31B, there is a semiconductor memory element such as a NAND-type flash memory. As an illustrative example of the fifth semiconductor element 34, there is a controller element of a semiconductor memory element, for example. The number of the semiconductor elements constituting the first and second element groups 25, 30 can be number more than one and it is not limited to two or three. The first element group 25 can be composed of more than three semiconductor elements. The second element group 30 can be composed of two or more than four semiconductor elements.

The first to fourth electrode pads 27A, 27B, 32A, 32B are respectively arranged along one side, concretely one long edge (long sides) 26a, 31a, of the outline of the first to fourth semiconductor elements 26A, 26B, 31A, 31B. In other words, the first to fourth semiconductor elements 26A, 26B, 31A, 31B respectively have a single long edge-pad structure. The fifth semiconductor element 34 has the electrode pads 35 arranged along two adjacent edges. The fifth semiconductor element 34 has an L-shaped pad structure. The fifth semiconductor element 34 is disposed to have the electrode forming surface, on which the electrode pad 35 is formed, facing upwardly, similarly to the other semiconductor elements.

The first and second semiconductor elements 26A, 26B having a single long end-pad structure is stacked in a stepped manner to expose the electrode pads 27A, 27B. In other words, the first and second semiconductor elements 26A, 26B are stacked so that their short edges 26b, 26b are aligned and their long edges 26a, 26a are off to one side to expose the first electrode pad 27A. The second electrode pad 27B is exposed by providing the spacer layer 29 between the first element group 25 and the second element group 30.

Similarly, the third and fourth semiconductor elements 31A, 31B are stacked in a stepped manner to expose the electrode pads 32A, 32B. The third and fourth semiconductor elements 31A, 31B are stacked so that their short edges 31b, 31b are aligned and their long edges 31a, 31a are off to one side to expose the third electrode pad 32A. Since the fifth semiconductor element 34 is smaller in shape than the other semiconductor elements, the electrode pad 32B of the fourth semiconductor element 31B is exposed when the fifth semiconductor element 34 is stacked on the fourth semiconductor element 31B.

The first to fourth semiconductor elements 26A, 26B, 31A, 31B are stacked so that their short edges are aligned, the long edges of the first semiconductor element 26A and the third semiconductor element 31A are aligned and the long edges of the second semiconductor element 26B and the fourth semiconductor element 31B are aligned. In other words, the second element group 30 is placed on the first element group 25 so that its position is matched to the position of the first element group 25 on the wiring board 22. The positions of the first element group 25 and the second element group 30 are the same with respect to the wiring board 22.

When such a stacked structure is employed, an increase of the area on the wiring board 22 occupied by the semiconductor elements 26, 31 is suppressed as exposing the respective electrode pads 27A, 27B, 32A, 32B. In other words, when the four semiconductor elements are all stacked in a stepped manner, the occupied area in the semiconductor element is an area for shifting three elements in addition to an area corresponding to a single semiconductor element. According to the present embodiment, the area occupied by the semiconductor elements 26, 31 is an area including an area for shifting one semiconductor element and an area corresponding to a single semiconductor element.

As described above, the plural semiconductor elements are grouped into the first and second element groups 25, 30, and the spacer layer 29 is provided between the first element group 25 and the second element group 30. Further, the position of the first and second element groups 25, 30 are matched after the semiconductor elements 26, 31 of the first and second element groups 25, 30 are stacked in a stepped manner. With this process, the single spacer layer 29 allows to expose the electrode pads 27A, 27B, 32A, 32B, and an increase in the area of the wiring board 22 occupied by the semiconductor elements 26, 31 can be suppressed. If more spacer layers 29 are provided, it causes an increased thickness of the stacked elements. Thus, the semiconductor device 21, which is thin and downsized, can be obtained.

The electrode pads 27A, 27B of the first and second semiconductor elements 26A, 26B are electrically connected to the connection pad 24 of the wiring board 22 via the first metal wires 37. When the electrical characteristics and signal characteristics are the same in the first electrode pad 27A and second electrode pad 27B, the metal wires 37 connected to the second electrode pad 27B is connected to the first electrode pad 27A to electrically connect the connection pad 24 and the second connection pad 27B via the first electrode pad 27A. The metal wires 37 can be respectively connected in a bonding process, or the connection pad 24, the first electrode pad 27A and the second electrode pad 27B can be connected in order by a single metal wire 37.

The electrode pads 32A, 32B of the third and fourth semiconductor elements 31A, 31B are electrically connected to the connection pads 24 of the wiring board 22 via the second metal wires 38. The second element group 30 can employ the connecting structure, which is the same as the first element group 25. The electrode pads 35 of the fifth semiconductor element 34 are electrically connected to the connection pads 24 of the wiring board 22 via the third metal wires 39. The metal wires 37, 38, 39 are composed of typical metal fine wires such as Au wires or Cu wires. Preferably, a reverse bonding that can suppress loop height is performed to the metal wires.

A resin sealer 40 made of, for example, epoxy resin, is formed by molding on the second surface 22b of the wiring board 22, where the semiconductor elements 26, 31, 34 are mounted. The semiconductor elements 26, 31, 34 are sealed by the resin sealer 40 integrally with the metal wires 37, 38, 39. With this structure, the semiconductor device 21 having a single side-stacked structure, which is used as BGA or LGA, can be obtained. The semiconductor device 21 according to the second embodiment is suitable for a semiconductor memory device, in which plural semiconductor memory elements are stacked to achieve a high capacity.

The thickness of the semiconductor elements 26, 31 in the first and second element groups 25, 30 are not limited. In the first and second element groups 25, 30, preferably, the thickness of the semiconductor elements 26A, 31A located at the lower side is made more than the thickness of the semiconductor elements 26B, 31B located at the upper side. Regarding the first element group 25, the first semiconductor element 26A is easily damaged during a wire bonding and can be cracked due to the unevenness on the surface of the wiring board 22 during a mold formation of the resin sealer 40. Thus, the thickness of the first semiconductor element 26A is preferably in a range of 80 to 150 μm.

Regarding the second element group 30, since the bonding portion of the third semiconductor element 31A is overhung, its flexure can reduce the wire bond ability. Accordingly, the thickness of the third semiconductor element 31A is preferably in a range of 100 to 180 μm. The thickness of the second and fourth semiconductor elements 26B, 31B is preferably 80 μm or less, more preferably, 70 μm or less, in order to suppress an increase in the thickness of stacked elements. The thickness of the semiconductor elements 26B, 31B is preferably 20 μm or more, similarly to the first embodiment. The thickness of the fifth semiconductor element 34 can be arbitrary determined according to functions and layer thickness.

The spacer layer disposed between the first and the second element groups 25, 30 can be composed of an insulating resin layer 41, which is capable of introducing the element side end of the metal wire 37, as shown in FIG. 15. The end of the metal wire 37, which is connected to the semiconductor element 26B located at the upper side in the first element group 25, is embedded in the insulating resin layer 41. The insulating resin layer 41 has a function as an adhesive layer in addition to a function as a spacer layer. The insulating resin layer 41 is composed of a thermoplastic resin such as acrylic resin or a thermosetting resin such as epoxy resin. The thickness of the insulating resin layer 41 is preferably in a range of 30 to 120 μm, and more preferably, in a range of 50 to 100 μm.

The present invention is not limited to the above described embodiments and is applicable to various semiconductor devices in which plural semiconductor elements are layered on one side of a circuit substrate such as a lead frame. Such semiconductor devices are included in the present invention. Further, the embodiments of the present invention can be expanded or modified within the scope of the technical idea of the present invention, and the expanded or modified embodiment is also included in the technical range of the present invention.

What is claimed is:

1. A semiconductor device, comprising:
   a lead frame including an element support and a lead portion having inner leads and outer leads, the lead frame having an area from the element support to the inner leads formed flat;
   a first semiconductor element having a first electrode forming surface on which first electrode pads are formed, the first semiconductor element being adhered to the lead frame via a first adhesive layer;
   first metal wires electrically connecting the inner leads and the first electrode pads; and
   a resin sealer sealing the first semiconductor element together with the first metal wires, the resin sealer having a rectangular shape with two long edges and two short edges, wherein
   the first electrode pads are arranged along one edge of the first semiconductor element corresponding to one of the two long edges of the resin sealer,
   the outer leads are disposed to respectively protrude from the two short edges of the resin sealer, and are bent in a direction which a lower surface of the lead frame faces,
   a first group of the inner leads in a first region are inflected from a first group of the outer leads that protrude from a first of the short edges of the resin sealer toward the edge of the first semiconductor element where the first electrode pads are arranged, and
   a second group of the inner leads in a second region are inflected from a second group of the outer leads that protrude from a second of the short edges of the resin sealer toward the edge of the first semiconductor element where the first electrode pads are arranged.

2. The semiconductor device according to claim 1, wherein the first electrode pads are only arranged along the edge of the first semiconductor element.

3. The semiconductor device according to claim 1, wherein the first semiconductor element is adhered to the lower surface of the lead frame via the first adhesive layer with the first electrode forming surface facing downward.

4. The semiconductor device according to claim 1, wherein the first semiconductor element has a rectangular shape with two long edges and two short edges, and the first electrode pads are arranged along one of the two long edges.

5. The semiconductor device according to claim 1, wherein a part of the inner leads is fixed using an insulating tape.

6. The semiconductor device according to claim 1, further comprising:
   a second semiconductor element having a second electrode forming surface on which second electrode pads are formed, the second semiconductor element being adhered to the first electrode forming surface of the first semiconductor element via a second adhesive layer; and
   second metal wires electrically connecting the inner leads and the second electrode pads, wherein the second electrode pads are arranged along one edge of the second semiconductor element corresponding to the edge of the first semiconductor element where the first electrode pads are arranged, and ends of the first metal wires, which are connected to the first electrode pads, are embedded in the second adhesive layer.

7. The semiconductor device according to claim 6, further comprising:

a third semiconductor element having a third electrode forming surface on which third electrode pads are formed, the third semiconductor element being adhered to the second electrode forming surface of the second semiconductor element via a third adhesive layer; and third metal wires electrically connecting the inner leads and the third electrode pads, wherein the third electrode pads are arranged along one edge of the third semiconductor element corresponding to the edge of the first semiconductor element where the first electrode pads are arranged, and ends of the second metal wires, which are connected to the second electrode pads, are embedded in the third adhesive layer.

8. The semiconductor device according to claim 7, further comprising:

a fourth semiconductor element having a fourth electrode forming surface on which fourth electrode pads are formed, the fourth semiconductor element being adhered to the third electrode forming surface of the third semiconductor element via a fourth adhesive layer; and fourth metal wires electrically connecting the inner leads and the fourth electrode pads, wherein the fourth electrode pads are arranged along one edge of the fourth semiconductor element corresponding to the edge of the first semiconductor element where the first electrode pads are arranged, and ends of the third metal wires, which are connected to the third electrode pads, are embedded in the fourth adhesive layer.

9. The semiconductor device according to claim 8, wherein the first, second, third and fourth semiconductor elements have a same rectangular shape, and are stacked to have their edges aligned.

10. The semiconductor device according to claim 9, wherein the first, the second, third and fourth electrode pads are arranged along odd long edges of the first, second, third and fourth semiconductor elements.

11. The semiconductor device according to claim 8, wherein the first adhesive layer has a thickness in a range of 10 to 30 μm and the second, third and fourth adhesive layers have a thickness in a range of 30 to 100 μm.

12. The semiconductor device according to claim 1, wherein the element support is disposed in a space defined by the first and second groups of inner leads which are inflected.

13. The semiconductor device according to claim 1, wherein the first and second groups of inner leads are inflected at least twice, respectively.

14. The semiconductor device according to claim 1, wherein the first and second groups of the inner leads are inflected twice in a direction of at least 45 degrees, respectively.

15. The semiconductor device according to claim 4, wherein the first group of the inner leads are disposed to protrude from a first of the two short edges of the first semiconductor element, and the second group of the inner leads are disposed to protrude from a second of the short edges of the first semiconductor element.

16. The semiconductor device according to claim 15, wherein the element support is disposed between the first and second groups of the inner leads.

17. The semiconductor device according to claim 1, wherein the element support has a through hole.

18. The semiconductor device according to claim 17, wherein the through hole has an elongate shape, and a longer direction of the through hole corresponds to a direction of the long edge of the resin sealer.

19. The semiconductor device according to claim 1, wherein the element support has a suspension pin provided at a side corresponding to one of the two long edges of the resin sealer.

20. The semiconductor device according to claim 1, wherein the element support has suspension pins provided at sides corresponding to the two long edges of the resin sealer.

* * * * *